United States Patent
Dowell et al.

[11] Patent Number: 5,491,890
[45] Date of Patent: Feb. 20, 1996

[54] METHOD OF MOUNTING ELECTRONIC COMPONENTS ON A CIRCUIT BOARD

[75] Inventors: Thomas L. Dowell, Noblesville; Richard S. King, Kokomo, both, Ind.

[73] Assignee: Delco Electronics Corp., Kokomo, Ind.

[21] Appl. No.: 353,746

[22] Filed: Dec. 12, 1994

[51] Int. Cl.$^6$ .............................. H05K 3/30; B23P 19/00
[52] U.S. Cl. ........................................ 29/837; 29/741
[58] Field of Search ............................. 29/741, 837, 739

[56] References Cited

U.S. PATENT DOCUMENTS

| | | | |
|---|---|---|---|
| 3,846,907 | 11/1974 | Ivonovic | 29/741 X |
| 4,218,817 | 8/1980 | Takano | 29/741 |
| 4,286,379 | 9/1981 | Kawa et al. | 29/741 X |
| 4,543,713 | 10/1985 | Rapp | 29/741 X |
| 4,628,594 | 12/1986 | Yamagami et al. | 29/741 |
| 4,833,776 | 5/1989 | Wakamiya et al. | 29/741 X |

*Primary Examiner*—Carl J. Arbes
*Attorney, Agent, or Firm*—Mark A. Navarre

[57] ABSTRACT

A carrier on a circuit board has inclined side planes canted at a predefined angle and a ledge. Flat components are placed on the carrier to rest on the inclined planes and the ledges and leads extending through holes in the circuit board. To correct the positions of misplaced components a guide having lower inner faces inclined at the same predefined angle is placed over the components, and a lift tool momentarily pushes up on the leads to position the components above the ledges so that when the lift tool is removed the guide will bias the components down against the ledges and the side planes.

9 Claims, 1 Drawing Sheet

METHOD OF MOUNTING ELECTRONIC COMPONENTS ON A CIRCUIT BOARD

FIELD OF THE INVENTION

This invention relates to the manufacture of electronic packages with heat sinking and particularly to a method of mounting electronic components for proper positioning in a package.

BACKGROUND OF THE INVENTION

It is known to package heat generating electrical components such as power ICs in single inline packages (SIPs) aligned in groups with leads soldered to a circuit board. Each SIP is a flat package with one major heat sink surface, such as a copper face, designed for heat dissipation by transfer to a heat sink. Various schemes were introduced to couple the SIPs to heat sinks.

In the interest of minimizing the circuit board space required for each SIP, it has been proposed to place the SIPs at an angle to the circuit board in two adjacent rows supported on a carrier between the rows for securely maintaining the position of each SIP with the heat sink surface facing outward, and a case enclosing the components and having internal surfaces tightly engaging the heat sink surfaces for efficient thermal transfer. FIG. 1 is an example of this configuration. There a circuit board 10 supports a carrier 12 which has inclined sides 14 at a predefined angle to one another, and a ledge 16 near the bottom of each side adjacent the circuit board. A row of SIPs 18 is seated on each ledge 16 with a surface 20 flush against an inclined side 14, and component leads 22 extend through holes in the circuit board 10. Heat sink surfaces 24 opposite the surfaces 20 face outward and a thermally conductive case 26 bears against the heat sink surfaces 24 for heat removal. For that purpose the case 26 includes opposing surfaces 28 having the same included predefined angle as the carrier sides 14 so as to bear flush against the heat sink surfaces 24 when the SIPs 18 are seated on the carrier. The case 26 extends across the circuit board 10 and other parts of the case, not shown, may similarly couple to other SIP and carrier assemblies on the same circuit board.

Several varieties of structures akin to that of FIG. 1 and using the same principles may be designed. A different carrier 12' is shown in FIG. 2 by way of example. For clarity, only one SIP 18 is shown installed on the carrier 12'. While FIG. 1 suggests that the sides 14 may be flat surfaces, the carrier 12' includes pairs of spaced ribs 32 instead of flat surfaces to define inclined planes and support the SIPs at the correct angle. A short ledge 16' is provided for each SIP. The space between the ribs 32 of each pair and beneath the SIP may contain a spring, not shown, for urging the SIP toward the case when assembled.

The manufacture of the assemblies requires that the SIPs be arranged on the carrier and the leads inserted through holes in the circuit board, soldering the leads to the board, and installing the case. It is important that before soldering, the components be properly seated on the ledges and the inclined sides; if the placement is not correct, the case will not contact the SIPs for good heat transfer, and the assembly is likely to fail either in testing or in use.

SUMMARY OF THE INVENTION

It is therefore an object of the invention to assemble flat package electrical components with correct seating on carriers. Another object is to correct improper placement of such components during assembly to carriers.

In the manufacture of the SIP and carrier assemblies, the carrier with sides inclined at a predefined angle and with ledges is assembled to the top surface of a horizontal circuit board, and an operator places the SIPs on the carrier with the heat sink surface outward. A common occurrence is that a SIP will be placed too close to the circuit board so that its lower edge is below the ledge; then the SIP can not seat properly on the carrier. It is difficult, especially under high volume production conditions, to detect each instance of improper placement by visual inspection.

An alignment method assures that all components are correctly seated by moving any misplaced parts to their proper place by a simple operation on each assembly without determining that a SIP is indeed out of place. After the SIPs are assembled to the circuit board adjacent the carrier, and before soldering, an alignment guide is placed over the assembly. The guide may be a free weight which sits over the assembly and includes inner side faces disposed at the same predefined angle as the carrier sides, so that each component is trapped between two parallel surfaces. The weight of the guide is sufficient to bias the SIPs against the carrier sides and to urge them down against the ledges. The circuit board is then locked in place and a plate beneath the circuit board is raised into contact with the end of the component leads and lifts the components against the bias of the guide a sufficient amount to assure that the lower edge of every component is above the ledge and is thus able, under the bias of the guide, to seat atop the ledge when the plate is retracted. Thus it is assured that each component is correctly situated and the guide remains in place to hold the parts secure until the circuit board is passed through a soldering station to fix the leads to the board. Thereafter, the guide is removed and the case is assembled to the circuit board to provide the heat sinking function.

BRIEF DESCRIPTION OF THE DRAWINGS

The above and other advantages of the invention will become more apparent from the following description taken in conjunction with the accompanying drawings wherein like references refer to like parts and wherein.

DESCRIPTION OF THE INVENTION

Figure 1:
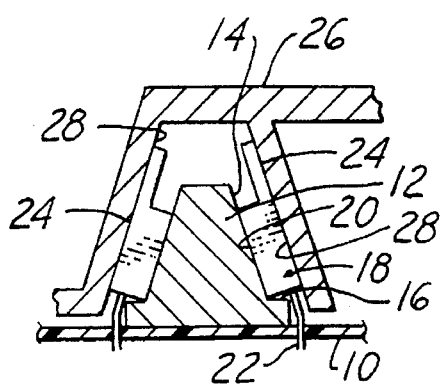
FIG. 1 is an end view of a flat package electronic component assembly according to the prior art which represents the type of assembly for which the subject invention is useful.
Figure 2:
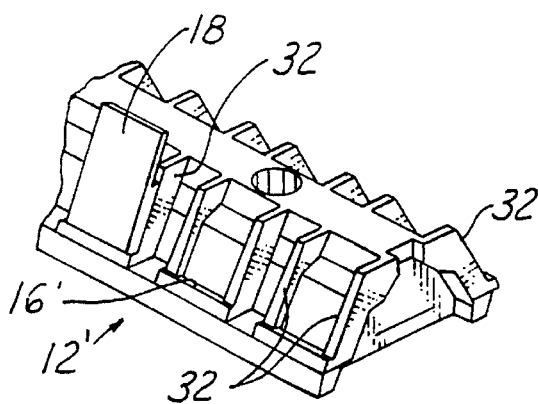
FIG. 2 is an isometric view of a carrier and a component according to the prior art.

In view of the discussion of FIGS. 1 and 2, it will be appreciated that typically the assembly of SIPs to a circuit board 10 implies that first a carrier 12 is installed on a circuit board between rows of circuit board holes which accommodate the leads of a plurality of SIPs along each side of the carrier. The circuit board is horizontal. The carrier has opposed sides 14 inclined at a predefined angle to hold components that are placed there. Each side, whether it be a flat surface or ribs, as in FIG. 2, defines a mounting plane for positioning the side 20 of each SIP at the inclined angle. Ledges 16 engage the bottom edges of the SIPS to align them at the same distance from the circuit board. The sizes of the carriers are variable according the number and size of SIPs in the assembly. Often an assembly will contain four to eight or more SIPs, and each SIP may have a body size on the order of 1 inch wide and 5/8 long in addition to lead length.

Figure 3:
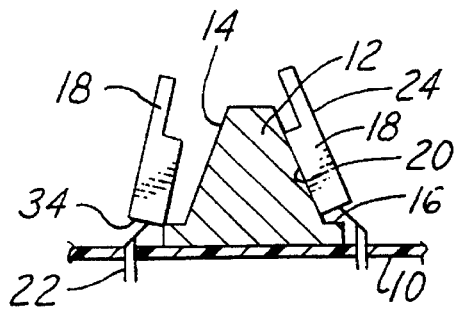
FIG. 3 is a schematic diagram of components placed on a carrier including a misaligned part.

The components are placed on the carrier with leads protruding through holes in the circuit board. As indicated in FIG. 3 at the left side, a component 18 may be misplaced so that its lower edge 34 is below the level of the ledge 16. The top of an improperly placed SIP 18 may be tilted outward as shown or tilted inward to rest on the side 14 of the carrier; either position is unacceptable.

Figure 4:
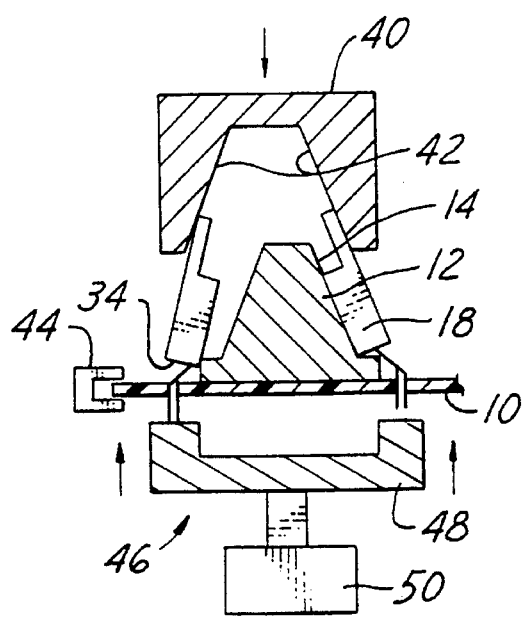
FIG. 4 is a schematic diagram of the assembly of FIG. 3 with alignment tools applied in a first alignment phase, according to the invention.

Alignment tools used to correct the improper alignment, as shown in FIG. 4, include a guide tool 40 which is a channel-shaped member having oppositely disposed lower faces 42 inclined at the same predefined angle as the sides 14 of the carrier 12. The guide tool 40 is made of aluminum or other light material to impose a small weight on the assembly. The weight may, for example, be about 8 to 12 ounces for assemblies having 4 to 8 SIPs, so that each SIP supports one or two ounces of weight. In addition to guide tool 40, other alignment equipment includes some mechanism to hold the circuit board in place, depicted here as a clamp 44, and a lead tool 46 beneath the circuit board for contact with the leads 22. The lead tool 46 comprises a plate 48 for lead contact and an elevator mechanism 50 to first raise the plate 48 momentarily and then retract it.

Figure 5:
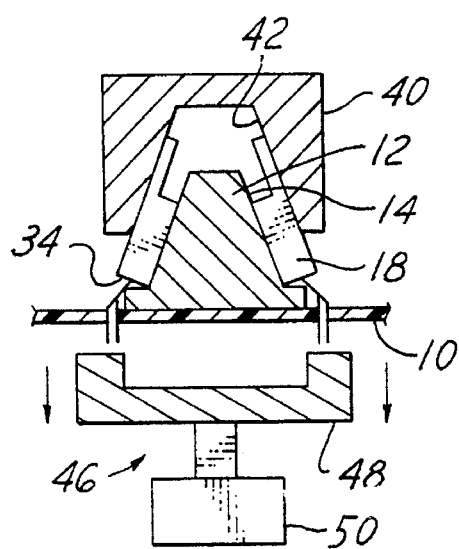
FIG. 5 is a schematic diagram of the assembly of FIG. 3 with alignment tools applied in another alignment phase, according to the invention.

To correct the misplacement of SIPs, the guide tool 40 is placed over the assembly to rest freely on the SIPs 18, as shown in FIG. 4. The faces 42 rest on the SIPs to urge them toward the mounting planes defined by the sides 14. Since the guide tool 40 is a free weight it is positioned by the SIPs so that it is not necessarily centered on the carrier if one or more SIPs are out of position. When the guide tool 40 is applied, the circuit board is located by one or more clamps 44 and the lead tool 46 beneath the circuit board is raised against the ends of the leads 22 of the SIPs to lift the improperly placed SIPs sufficiently for the lower edge 34 to clear the ledge 16. Preferably the lead tool travel is sufficient to lift all the leads slightly. When the components are so lifted they are pushed up against the guide tool 40 which yields, due to its light weight, to allow such movement. When the ledge is cleared, the weight of the guide tool 40 moves the SIPs against the inclined sides 14. Then the lead tool 46 is retracted, as shown in FIG. 5, and the guide tool pushes the SIPs down against the ledge to complete the alignment. The clamps 44 are released and the assembly is soldered to fix the components in place. The guide tool 40 remains on the assembly to hold the components during the solder operation.

It will thus be seen that the correct assembly of the flat components to the circuit board and carrier is assured by the method described here, and that corrections of misplaced components are effected without visual inspection. The method itself is simple and inexpensive to implement and only simple tooling is required.

The embodiments of the invention in which an exclusive property or privilege is claimed are defined as follows:

1. A method of mounting a plurality of flat package heat generating electronic components to a component carrier on a circuit board, each component having electrical leads and a mounting surface and an edge adjacent the leads, the component carrier having ledge means adjacent the circuit board for locating the edges of the components and mounting means defining a locating plane at an angle to the circuit board for holding the components with the mounting surfaces in the locating plane, the method comprising the steps of:

placing the electronic components on the carrier with the component leads protruding through circuit board openings wherein some components are subject to improper placement relative to the ledge means and the mounting means;

correcting the improper placements by
   biasing the components toward the mounting means and toward the circuit board for seating the edges on the ledge means and the mounting surfaces into the locating plane, and
   momentarily moving at least some of the components away from the circuit board for alignment with the ledge means; and while continuing the biasing step, soldering the leads of the components to the circuit board.

2. The invention as defined in claim 1 including a guide tool having a guide face parallel to the locating plane, wherein the step of biasing the components comprises applying the guide face to the components to urge the components against the mounting means and the ledge means.

3. The invention as defined in claim 1 wherein moving at least some of the components away from the circuit board comprises pushing the component leads with a tool to move the edges to a position which enables seating on the ledge means.

4. The invention as defined in claim 2 wherein the step of momentarily moving at least some of the components away from the circuit board comprises:

applying a lead tool to the component leads to push the components against the bias of the guide tool to assure that each edge is positioned farther from the circuit board than the ledge means; and retracting the lead tool for movement of the edges against the ledge means by the guide tool.

5. A method of mounting a plurality of flat package heat generating electronic components on a component carrier on an upper side of a generally horizontal circuit board, each component having a heat sink surface on one side and a mounting surface on the opposite side and a plurality of leads, the component carrier having ledge means adjacent the circuit board and a central portion defining a pair of oppositely disposed mounting planes extending upwardly from the ledge means and canted toward each other at a predefined angle, the method comprising the steps of:

placing the components on the carrier with the leads of the component protruding through circuit board openings adjacent the ledge means such that, when properly placed, a lower surface of each component seats on the ledge means, and each component rests on the central portion with its mounting surface in a mounting plane;

positioning a guide tool over the placed components to bias the components downward into engagement with the ledge means and the central portion of the carrier;

applying a lifting tool to lift at least improperly placed components against the bias of the guide tool;

then releasing the lifting tool for proper component placement by the guide tool; and soldering the leads of the components to the circuit board.

6. The invention as defined in claim 5 wherein the guide tool comprises a weight for resting on the components and which is free to move according to the position of the components.

7. The invention as defined in claim 5 wherein the guide tool comprises a pair of flat oppositely disposed faces canted toward each other at the predefined angle for respective parallel relationship with the mounting planes when the components are properly placed.

8. The invention as defined in claim 5 wherein the lifting tool comprises a plate beneath the circuit board and the step of applying the lifting tool comprises:

bringing the plate into engagement with component leads protruding through the circuit board to lift improperly placed components above the ledge means to enable proper placement by the guide tool.

9. The invention as defined in claim 7 wherein the lifting tool comprises a plate beneath the circuit board and the step of applying the lifting tool comprises:

bringing the plate into engagement with component leads protruding through the circuit board to lift all the components upward against respective faces of the guide tool.

* * * * *